United States Patent [19]

Shin et al.

[11] Patent Number: 5,776,250

[45] Date of Patent: Jul. 7, 1998

[54] DEVICE FOR RECOVERING PHOTORESIST MATERIAL EXHAUSTED FROM A SPIN COATER

[75] Inventors: Dong-Hwa Shin; Young-Min Ko, both of Suwon, Rep. of Korea

[73] Assignee: Samsung Electronics Co., Ltd., Suwon, Rep. of Korea

[21] Appl. No.: 768,700

[22] Filed: Dec. 18, 1996

[30] Foreign Application Priority Data

Dec. 29, 1995 [KR] Rep. of Korea .................. 95-65739

[51] Int. Cl.⁶ .................. B05B 1/28; B05B 3/04; B05C 11/02; B08B 3/04
[52] U.S. Cl. .................. 118/326; 118/52; 118/320; 134/902; 134/104.3
[58] Field of Search .................. 118/326, 52, 319, 118/320, 54, 104.3; 134/902, 149, 104.2; 396/317

[56] References Cited

U.S. PATENT DOCUMENTS 5,289,822   3/1994   Hurtig .................. 396/317

*Primary Examiner*—Donald E. Ozaja
*Assistant Examiner*—Calvin Padgett
*Attorney, Agent, or Firm*—Jones & Volentine, L.L.P.

[57] ABSTRACT

A device is for recovering superfluous photoresist material exhausted from a spin coater having a drive motor alternately operated at a high speed and a low speed at predetermined intervals. The device includes a solution collecting member into which superfluous photoresist material and cleaning solution are collected after a photoresist is coated onto a wafer and the wafer is cleaned during operation of the drive motor. The solution collecting member has a groove circumferentially formed therein to allow the superfluous photoresist material to flow therein. First and second discharge pipes communicate with the solution collecting member to drain the superfluous photoresist material and a cleaning solution and a third discharging pipe communicates with the groove formed in the solution collecting member. An actuator is provided to move a blocking member between an open position and closed position to open and close the groove.

5 Claims, 3 Drawing Sheets

DEVICE FOR RECOVERING PHOTORESIST MATERIAL EXHAUSTED FROM A SPIN COATER

BACKGROUND OF THE INVENTION

1. Field of the Invention

The present invention relates to a spin coater, and more particularly, to a device for recovering photoresist material exhausted from a spin coater, the device recovering superfluous photoresist material supplied by the spin coater onto a wafer while rotating at a high speed to allow reuse thereof.

2. Description of the Prior Art

Generally, in a photolithographic process, photoresist material is first applied to form a micro pattern onto a wafer, and a spin coater is frequently used for this purpose.

Referring to FIG. 1, there is illustrated an exploded perspective view of a spin coater of the prior art. The spin coater includes a drive motor 1 provided below the center portion of a support plate 2. A rotating plate 5 is mounted to the upper end of a rotating shaft 3 of the drive motor 1, the rotating shaft 3 projecting upwardly through the support plate 2. The rotating plate 5, on which a wafer 4 is placed, is rotated by operation of the drive motor 1. A cleaning nozzle 6 is positioned adjacent a radial outer portion of the lower surface of the rotating plate 5 so as to clean the lower surface and an edge portion of the wafer 4 by spraying of a cleaning solution. A solution collecting member 7 is provided above the wafer 4. The solution collecting member 7 has a gutter 7a formed therein for collection of the cleaning solution and superfluous photoresist material remaining after coating onto the wafer 4 from another nozzle (not shown). The solution collecting member 7 includes a cover 8 having an opening for allowing the photoresist material to be supplied therethrough onto the wafer 4. The solution collecting member 7 also has first and second discharging pipes 7b and 7c secured to the lower surface thereof for draining of the superfluous photoresist material and the cleaning solution collected along the gutter 7a.

In the spin coater constructed as above, after the wafer 4 is placed by a robotic conveyer (not shown) and fixed onto the rotating plate 5, the rotating plate 5 is rotated at a high speed by operation of the driver motor 1, and the photoresist material is supplied onto the wafer 4 from another nozzle (not shown) so as to be evenly dispersed on the upper surface of the wafer 4 as a result of a centrifugal force caused by the high speed rotation. In this manner, the photoresist is coated on the wafer 4 at a constant thickness.

As can be seen from FIG. 2, the photoresist material is initially sprayed onto the wafer 4 for a time $t_1$ while the wafer 4 is first spun at a low speed. The photoresist material is then evenly dispersed on the upper surface of the wafer 4 by action of a centrifugal force caused when the wafer 4 is spun at a high speed to obtain a photoresist coating of a constant thickness. The lower surface and edge portion of the wafer 4 are cleaned by the cleaning solution during a time $t_2$ and $t_3$ as the wafer 4 is again spun at a low speed. Lastly, superfluous photoresist material and cleaning solution are drained through the discharging pipes 7b and 7c as the wafer 4 is spun at a low speed and then a high speed.

However, only a portion of the photoresist material is actually coated onto the wafer 4, and in fact, in excess of 50% of the sprayed photoresist material is drained. For example, when 5 cc of photoresist material is sprayed for one wafer, only 1 to 2 cc is actually applied as a photoresist coating, and the remaining 3 to 4 cc of the sprayed photoresist material is drained. Therefore, the spin coater of the prior art suffers a drawback in that the utilization efficiency of photoresist material stands at under 30%, and a substantial amount of photoresist material is wasted, thus degrading the economics of the process. Also, since the photoresist material is intermixed with the cleaning solution prior to being drained, the photoresist material can not be re-used and it is instead discarded in this intermixed state, thus being environmentally harmful.

SUMMARY OF THE INVENTION

Accordingly, the present invention has been made in an effort to overcome the drawbacks of the prior art, and it is an object of the present invention to provide a device for recovering photoresist material exhausted from a spin coater, which recovers superfluous photoresist material supplied onto a wafer, to allow reuse thereof.

According to one aspect of the present invention, there is provided a device for recovering superfluous photoresist material exhausted from a spin coater having a drive motor alternately operated at a high speed and a low speed at predetermined intervals. The device includes a solution collecting member into which superfluous photoresist material and cleaning solution are collected after a photoresist is coated onto a wafer and the wafer is cleaned by operation of the drive motor, said solution collecting member having a first collection area, such as a circumferentially extending groove formed therein, and a second collection area which allow the superfluous photoresist material and the cleaning solution to stream therein; first and second discharge pipes communicating with the second collection area of the solution collecting member to drain the superfluous photoresist material and the cleaning solution; a third discharge pipe communicating with the first collection area formed in the solution collecting member; and a blocking member provided in proximity to the first collection area and vertically moved between an open position and closed position to open or close the first collection area.

According to another aspect of the present invention, the blocking member is moved by an actuator to the open position when the photoresist material is sprayed, and is moved to the closed position when the cleaning solution is sprayed.

According to still another aspect of the present invention, the actuator is a solenoid valve.

As a result of the features of the present invention, at least 50% of the supply of sprayed photoresist material for coating a wafer is saved, and thus manufacturing costs can be reduced, and discharge of environmentally harmful chemicals can be minimized.

BRIEF DESCRIPTION OF THE DRAWINGS

The above objects, and other features and advantages of the present invention will become more apparent after a reading of the following detailed description taken in conjunction with the drawings, in which.

3

Figure 1:
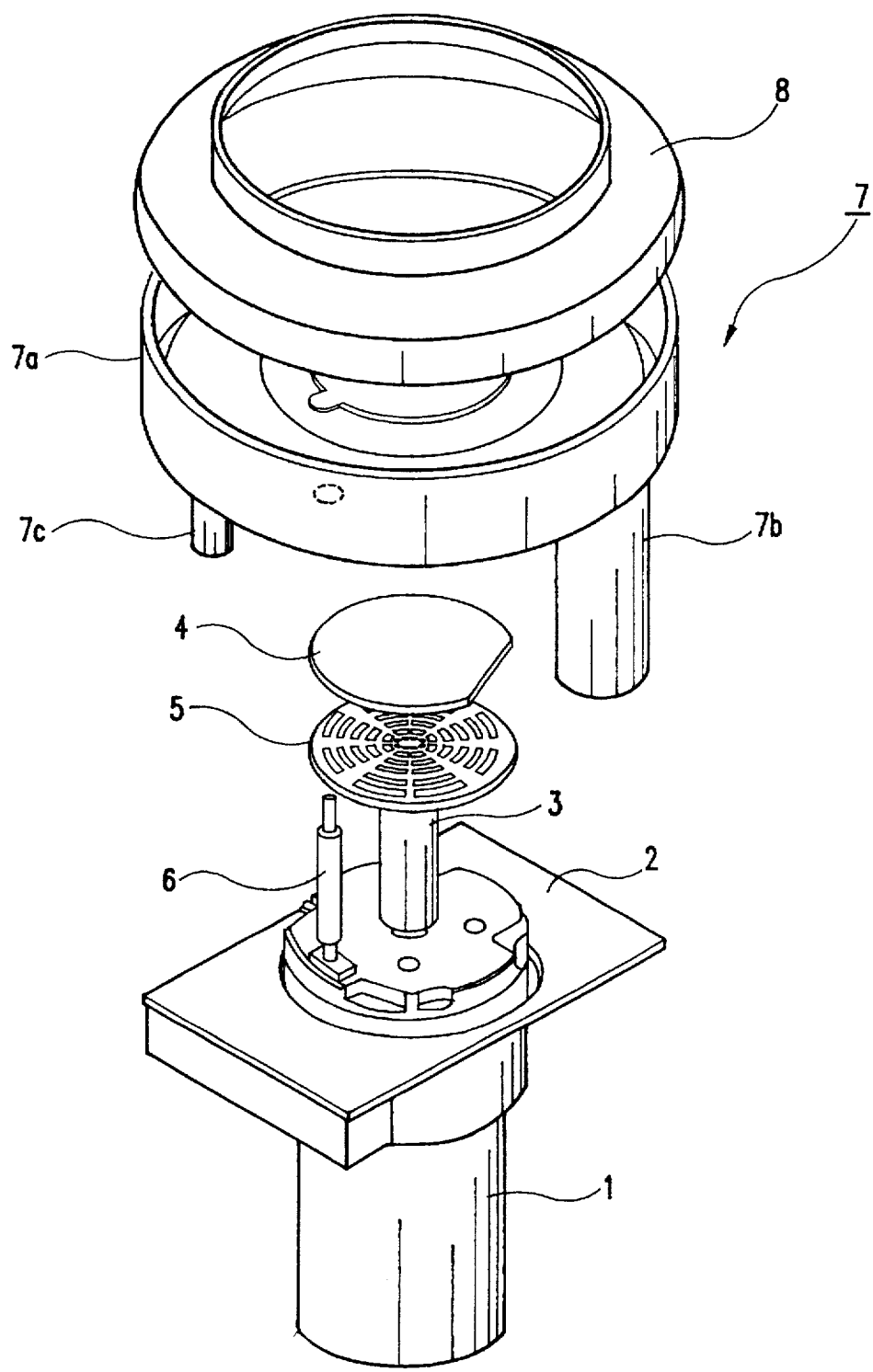
FIG. 1 is an exploded perspective view of a spin coater of the prior art.
Figure 2:
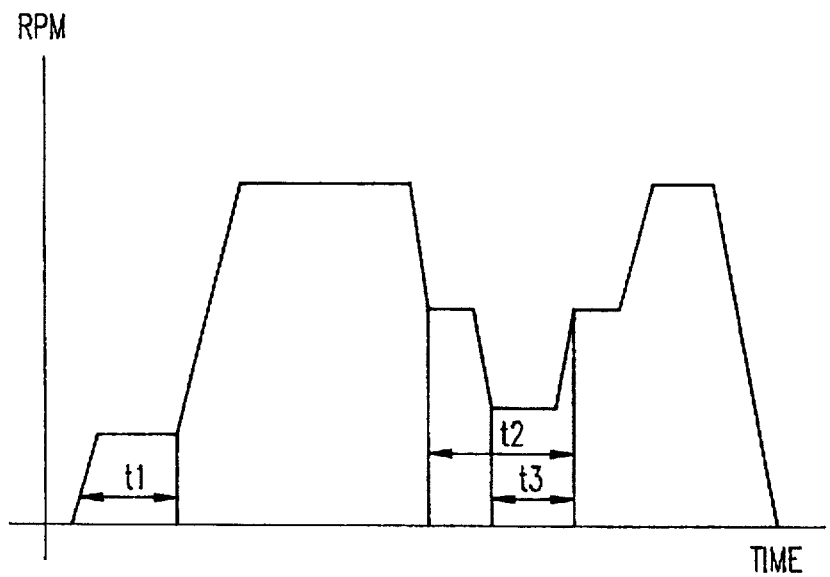
FIG. 2 is a graph illustrating the relationship between application times of the photoresist material and cleaning solution onto a wafer and the RPM of the wafer, in the spin coater of FIG. 1.
Figure 3:
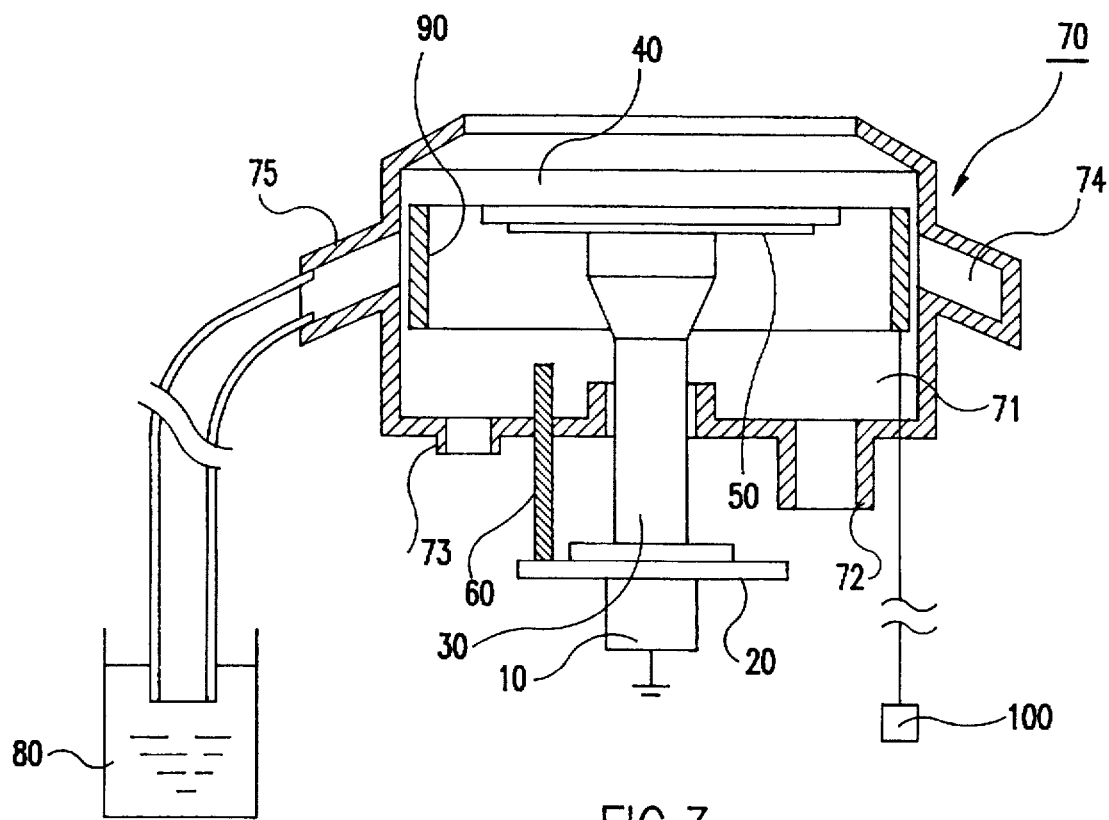
FIG. 3 is a cross-sectional view of a spin coater incorporating a device for recovering photoresist material in accordance with an embodiment of the present invention.
Figure 4:
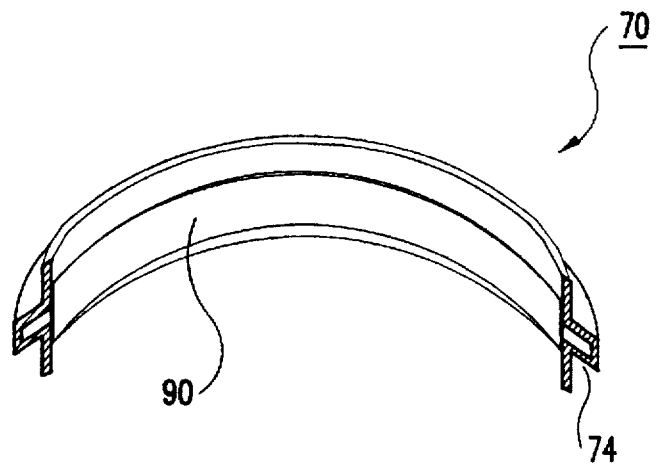
Figure 5:
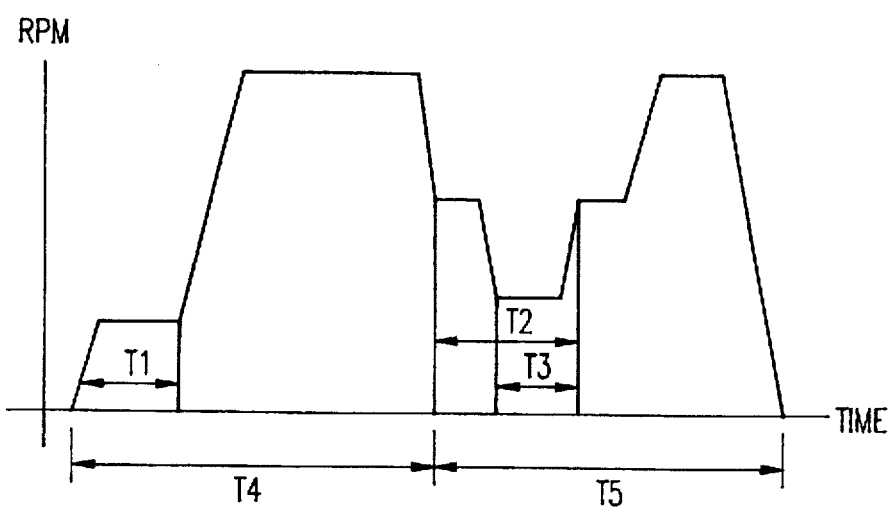

FIG. 4 is a cut-away perspective view illustrating a main part of the device for recovering photoresist material of FIG. 3; and FIG. 5 is a graph illustrating the relationship between an opening and closing timing of an actuator and the RPM of a wafer, in the spin coater of FIG. 3.

DETAILED DESCRIPTION OF PREFERRED EMBODIMENT

Reference will now be made in detail to the present preferred embodiment of the invention, an example of which is illustrated in the accompanying drawings. Wherever possible, the same reference numerals will be used throughout the drawings to refer to the same or like parts.

Referring to FIGS. 3 and 4, the device according to the present invention includes a solution collecting member 70, disposed around the wafer, which collects both superfluous photoresist material and cleaning solution after a wafer 40 has undergone a coating and cleaning processes. The solution collecting member 70 is formed having a gutter 71 disposed at the bottom portion of the solution collection member 70 such that along the gutter 71 which are collected both superfluous photoresist material remaining after coating onto the wafer 40 and cleaning solution sprayed by a cleaning nozzle 60 to clean a lower surface and an edge portion of the wafer 40. First and second discharging pipes 72 and 73 are secured to the lower surface of the solution collecting member 70 and communicate with the gutter 71 to allow for draining of the superfluous photoresist material and the cleaning solution collected along the gutter 71.

A circumferential groove 74 is formed in the vertical wall portion of the solution collecting member 70, and the circumferential groove 74 is arranged above the discharging pipes 72 and 73. The superfluous photoresist material applied onto the wafer 40 is streamed downward along the inner surface of the vertical wall portion of the solution collecting member 70 and is received into the circumferential groove 74 where it is drained prior to reaching the gutter 71 and the discharge pipes 72 and 73. A third discharge pipe 75 is provided for draining the photoresist material received in the circumferential groove 74 into a drain box 80. That is, one end of the third discharge pipe 75 is connected into the circumferential groove 74, and the other end of the third discharging pipe 75 is connected with the drain box 80. A circular or cylindrical plate 90, disposed in close proximity to the inner surface of the vertical wall portion of the solution collecting member 70, is vertically moveable to close and open the circumferential groove 74.

A solenoid valve 100 is connected to the circular plate 90 to control the closing or opening movement thereof.

In the device for recovering photoresist material exhausted from a spin coater, constructed as above, when the wafer 40 placed on a rotating plate 50 is rotated at a high speed by operation of a drive motor 10, photoresist material sprayed onto the upper surface of the wafer 40 by a nozzle (not shown) is evenly dispersed on the upper surface of the wafer 40 by a rotation-resultant centrifugal force to coat the wafer 40 with a photoresist layer of a constant thickness. That is to say, as can be seen from FIG. 5, the photoresist material is sprayed onto the wafer 40 for a time $T_1$ while the wafer 40 is first spun at a low speed, and is evenly dispersed on the upper surface of the wafer 40 by centrifugal force to coat the photoresist material at a constant thickness while the wafer 40 is then spun at a high speed. During this time, the circular plate 90 is moved by the operation of the solenoid valve 100 to open the circumferential groove 74 for

4 a time $T_4$ to allow superfluous photoresist material to flow into the circumferential groove 74. Thereafter, the lower surface and the edge portion of the wafer 40 is cleaned by application of a cleaning solution for a time $T_2$ and $T_3$ while the wafer 40 is again spun at a low speed, during which time the circular plate 90 is maintained in the closed position for a time $T_5$.

As a result, by automatically controlling the closing/opening movement of the circular plate 90 using the solenoid valve 100, it is possible to recover a substantial portion of the superfluous photoresist material prior to its being intermixed with the cleaning solution.

Photoresist material is also collected into the gutter 71 of the solution collecting member 70. However, since it is a small amount and is apt to be intermixed with cleaning solution, it is drained through the first and second discharge pipes 72 and 73 to be discarded. On the other hand, most of the photoresist material which is still of good quality is flowed into the circumferential groove 74 and is drained into the drain box 80 to be recirculated.

The device for recovering superfluous photoresist material of present invention is advantageous in that the utilization efficiency of the photoresist material is increased to at least 50%, and thus manufacturing costs are reduced and discharge of environmentally harmful chemicals is minimized.

While the present invention has been described and illustrated with reference to preferred embodiment thereof, it is to be readily understood that the present invention not limited to the embodiment, and various changes and modifications can be made therein without departing from the spirit and scope of the invention defined in the appended claims.

What is claimed is:

1. A device for recovering superfluous photoresist material exhausted from a spin coater, the spin coater having a drive motor for alternately rotating a wafer at high and low speeds at predetermined intervals, comprising:

a solution collecting member disposed around the wafer into which superfluous photoresist material and a cleaning solution are collected after a photoresist is coated onto the wafer and the wafer is cleaned during operation of said drive motor, said solution collecting member having at least one first inner wall defining a first collection area into which the superfluous photoresist material is collected, and having at least one second inner wall defining a second collection area into which a mix of the superfluous photoresist material and the cleaning solution is collected;

at least one first discharge pipe in flow communication with said first collection area of said solution collecting member;

at least one second discharge pipe in flow communication with said second collection area of said solution collecting member;

a blocking member moveably disposed at an opening of said first collection area and moveable between an open position and a closed position to open and close said first collection area; and an actuator communicating with said blocking member for moving said blocking member to the open position when a photoresist material is sprayed on the wafer by the spin coater, and for moving said blocking member to the closed position when the cleaning solution is sprayed on the wafer by the spin coater.

2. A device for recovering superfluous photoresist material exhausted from a spin coater, the spin coater having a drive motor for alternately rotating a wafer at high and low speeds at predetermined intervals, comprising:

a solution collecting member disposed around the wafer into which superfluous photoresist material and a cleaning solution are collected after a photoresist is coated onto the wafer and the wafer is cleaned during operation of said drive motor, said solution collecting member having at least one first inner wall defining a first collection area into which the superfluous photoresist material is collected, and having at least one second inner wall defining a second collection area into which a mix of the superfluous photoresist material and the cleaning solution is collected, wherein said first collection area is defined by said at least one first inner wall forming a circumferential groove located along an inner surface of a vertical wall of said solution collecting member, and wherein said second collection area is located below said circumferential groove;

at least one first discharge pipe in flow communication with said first collection area of said solution collecting member;

at least one second discharge pipe in flow communication with said second collection area of said solution collecting member; and a blocking member moveably disposed adjacent to said first collection area and moveable between an open position and a closed position to open and close said first collection area.

3. A device as claimed in claim 2, wherein said blocking member is a circular plate positioned in proximity to said circumferential groove and vertically movable to the closed position to cover said circumferential groove.

4. A device as claimed in claim 1, wherein said actuator is a solenoid valve.

5. A device as claimed in claim 1, wherein said first collection area is located above said second collection area.

* * * * *